(12) United States Patent
Kai

(10) Patent No.: US 10,148,245 B2
(45) Date of Patent: Dec. 4, 2018

(54) ELASTIC WAVE DEVICE

(71) Applicant: Murata Manufacturing Co., Ltd., Nagaokakyo-shi, Kyoto-fu (JP)

(72) Inventor: Seiji Kai, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 397 days.

(21) Appl. No.: 15/177,462

(22) Filed: Jun. 9, 2016

(65) Prior Publication Data
US 2016/0380611 A1    Dec. 29, 2016

(30) Foreign Application Priority Data

Jun. 25, 2015   (JP) ................................. 2015-127149
Apr. 22, 2016   (JP) ................................. 2016-086285

(51) Int. Cl.
*H03H 9/13*      (2006.01)
*H03H 9/02*      (2006.01)
*H03H 9/10*      (2006.01)

(52) U.S. Cl.
CPC .... *H03H 9/02574* (2013.01); *H03H 9/02984* (2013.01); *H03H 9/02992* (2013.01); *H03H 9/1071* (2013.01)

(58) Field of Classification Search
CPC .......... H03H 9/02574; H03H 9/02992; H03H 9/02984; H03H 9/1071

USPC .............. 310/313 A–313 D, 313 R, 340, 344
See application file for complete search history.

(56) References Cited

U.S. PATENT DOCUMENTS

2013/0285768 A1    10/2013  Watanabe et al.
2016/0277003 A1*    9/2016  Kikuchi ................... H03H 3/08
2016/0294354 A1*   10/2016  Saijo ..................... H03H 9/1071
2018/0097502 A1*    4/2018  Yamamoto ............. H03H 9/145

FOREIGN PATENT DOCUMENTS

WO    2012/086639 A1    6/2012

* cited by examiner

*Primary Examiner* — Thomas Dougherty
(74) *Attorney, Agent, or Firm* — Keating & Bennett, LLP

(57) ABSTRACT

An elastic wave device includes a support substrate and a laminated film disposed on the support substrate. A portion of the laminated film is removed in a region outside a region in which an interdigital transducer electrode is disposed and below a region to which an external connection terminal is joined. An insulating layer is disposed in at least a portion of the region in which the portion of the laminated film is removed. A support layer is disposed on the insulating layer so as to surround the region in which the interdigital transducer electrode is disposed. A main component of a material of which the support layer is made is about 50% or more identical to a main component of a material of which the insulating layer is made. A cover is secured to the support layer to seal a cavity defined by the support layer.

20 Claims, 7 Drawing Sheets

ELASTIC WAVE DEVICE

CROSS REFERENCE TO RELATED APPLICATIONS

This application claims the benefit of priority to Japanese Patent Application 2015-127149 filed Jun. 22, 2015 and Japanese Patent Application 2016-086285 filed Apr. 22, 2016. The entire content of each application are hereby incorporated by reference.

BACKGROUND OF THE INVENTION

1. Field of the Invention

The present invention relates to an elastic wave device including a laminated film that includes a piezoelectric thin film and is laminated on a support substrate.

2. Description of the Related Art

In an elastic wave device disclosed in International Publication No. WO2012/086639, a laminated film is disposed on a support substrate and a piezoelectric thin film is laminated on the laminated film. The laminated film includes a high-acoustic-velocity film and a low-acoustic-velocity film. The low-acoustic-velocity film is a film through which a bulk wave propagates at an acoustic velocity lower than an acoustic velocity at which a bulk wave propagates through the piezoelectric thin film. The high-acoustic-velocity film is a film through which a bulk wave propagates at an acoustic velocity higher than an acoustic velocity at which an elastic wave propagates through the piezoelectric thin film. The low-acoustic-velocity film is laminated on the high-acoustic-velocity film. Interdigital transducer (IDT) electrodes are disposed on the piezoelectric thin film.

In the elastic wave device disclosed in International Publication No. WO2012/086639, the piezoelectric thin film is made of a piezoelectric single crystal such as LiTaO$_3$. Accordingly, the piezoelectric thin film may crack or chip when a multilayer body including the piezoelectric thin film and the laminated film is cut to obtain individual elastic wave devices in a dicing process.

In an elastic wave device including a support layer and a cover for providing a hollow space on the IDT electrodes, the sealability of the hollow space may not be sufficiently increased. Accordingly, sufficient reliability of the elastic wave device may not be ensured.

SUMMARY OF THE INVENTION

Preferred embodiments of the present invention provide an elastic wave device with effectively improved reliability in which a piezoelectric thin film is less likely to crack and chip.

An elastic wave device according to a preferred embodiment of the present invention includes a support substrate, a laminated film that is disposed on the support substrate and includes a piezoelectric thin film and a layer other than the piezoelectric thin film, an interdigital transducer electrode that is disposed on a surface of the piezoelectric thin film, an external connection terminal that is electrically connected to the interdigital transducer electrode and to an outside, an insulating layer, a support layer, and a cover. A portion of the laminated film is removed in a region outside a region in which the interdigital transducer electrode is disposed in plan view and below a region to which the external connection terminal is joined, and the insulating layer is disposed in at least a portion of the region in which the portion of the laminated film is removed. The external connection terminal includes at least one of an under-bump metallic layer and a metallic bump. The support layer is disposed on the insulating layer to surround the region in which the interdigital transducer electrode is disposed, and a main component of a material of which the support layer is made is about 50% or more identical to a main component of a material of which the insulating layer is made. The cover is secured to the support layer so as to seal a cavity defined by the support layer.

In an elastic wave device according to a preferred embodiment of the present invention, the insulating layer may extend from at least the portion of the region in which the portion of the laminated film is removed to the surface of the piezoelectric thin film. Delamination of the laminated film is less likely to occur at an interface in the laminated film and delamination of the piezoelectric thin film of the laminated film is less likely to occur.

An elastic wave device according to a preferred embodiment of the present invention may further include a wire electrode that is electrically connected to the interdigital transducer electrode, that extends from the surface of the piezoelectric thin film to a surface of the insulating layer, and that extends to a surface of a portion of the insulating layer disposed in the region in which the portion of the laminated film is removed. In this case, the external connection terminal is able to be joined to the wire electrode above the region in which the portion of the laminated film is removed. Accordingly, when the external connection terminal is joined to the wire electrode, the piezoelectric thin film is less likely to crack and chip even when a force is applied to the piezoelectric thin film.

In an elastic wave device according to a preferred embodiment of the present invention, the external connection terminal may be joined to the wire electrode.

In an elastic wave device according to a preferred embodiment of the present invention, the insulating layer and the support layer may be made of a synthetic resin. In this case, adhesion between the insulating layer and the support layer is improved. In addition, the sealability of a hollow space defined by the support substrate, the support layer, and the cover preferably is improved. The reliability of the elastic wave device is thus effectively improved.

In an elastic wave device according to a preferred embodiment of the present invention, the insulating layer may extend from the surface of the piezoelectric thin film to a side surface of the piezoelectric thin film and a side surface of the laminated film and extend to at least the portion of the region in which the portion of the laminated film is removed. In this case, delamination of the laminated film is much less likely to occur at an interface in the laminated film and delamination of the piezoelectric thin film of the laminated film is much less likely to occur.

In an elastic wave device according to a preferred embodiment of the present invention, the insulating layer may include, on a side opposite the support substrate, a slanted surface extending from a region in which the insulating layer is disposed on the support substrate to a portion of the insulating layer disposed on the piezoelectric thin film, and the slanted surface may be slanted so as to extend toward the piezoelectric thin film with increasing distance from the support substrate. The wire electrode may include a portion disposed on the slanted surface of the insulating layer, and the portion may be slanted along the slanted surface of the insulating layer. In this case, breakage of the wire electrode is less likely to occur.

In an elastic wave device according to a preferred embodiment of the present invention, the insulating layer may extend from the slanted surface of the insulating layer to a region in which the portion of the laminated film including the piezoelectric thin film is removed. In this case, breakage of the wire electrode is less likely to occur.

In an elastic wave device according to a preferred embodiment of the present invention, the slanted surface of the insulating layer may extend to a region on the support substrate in which the portion of the laminated film is removed and the insulating layer is not laminated. The wire electrode may extend to a region on the support substrate in which the portion of the laminated film is removed and the insulating layer is not laminated. In this case, separation of the wire electrode is less likely to occur and breakage of the wire electrode is less likely to occur.

In an elastic wave device according to a preferred embodiment of the present invention, the layer of the laminated film other than the piezoelectric thin film may include a high-acoustic-velocity film through which a bulk wave propagates at an acoustic velocity higher than an acoustic velocity at which an elastic wave in a main mode propagates through the piezoelectric thin film, and the piezoelectric thin film may be laminated on the high-acoustic-velocity film.

In an elastic wave device according to a preferred embodiment of the present invention, the layer of the laminated film other than the piezoelectric thin film may include a high-acoustic-velocity film through which a bulk wave propagates at an acoustic velocity higher than an acoustic velocity at which an elastic wave in a main mode propagates through the piezoelectric thin film, and a low-acoustic-velocity film through which a bulk wave propagates at an acoustic velocity lower than an acoustic velocity at which an elastic wave in the main mode propagates through the piezoelectric thin film, the low-acoustic-velocity film may be laminated on the high-acoustic-velocity film, and the piezoelectric thin film may be laminated on the low-acoustic-velocity film.

In an elastic wave device according to a preferred embodiment of the present invention, the laminated film may include a high-acoustic-impedance film having a comparatively high acoustic impedance and a low-acoustic-impedance film having an acoustic impedance lower than the acoustic impedance of the high-acoustic-impedance film.

Various preferred embodiments of the present invention provide an elastic wave device with effectively improved reliability in which the piezoelectric thin film is less likely to crack and chip.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will hereinafter be described in detail with reference to the drawings to clarify the present invention.

The preferred embodiments are described by way of example in the present disclosure. The features of the present invention can be partially replaced or combined between the preferred embodiments.

Figure 1:
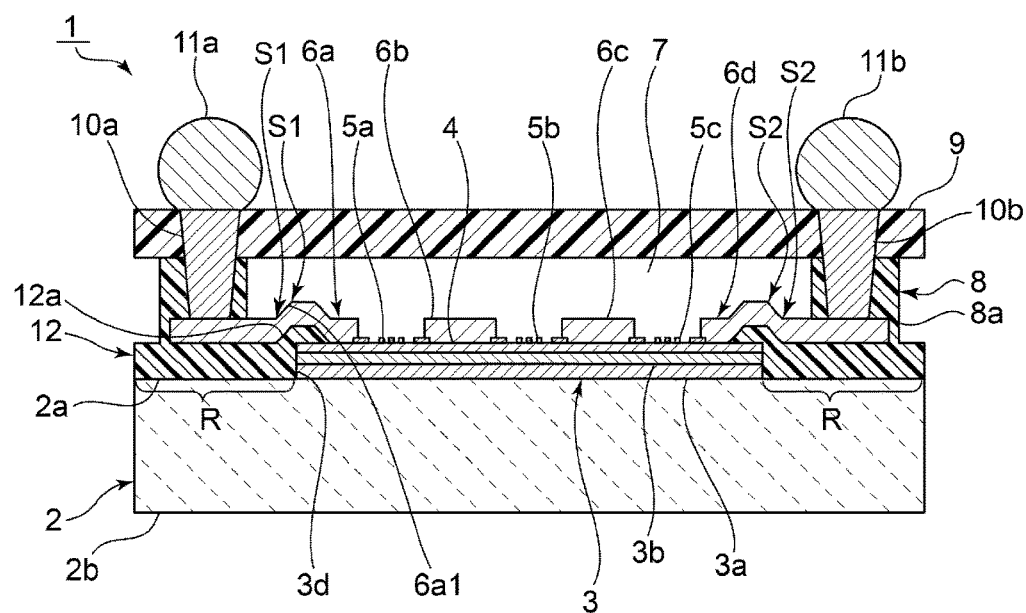
FIG. 1 is a sectional view of an elastic wave device according to a first preferred embodiment of the present invention that is taken along line I-I in FIG. 2.

FIG. 1 is a sectional view of an elastic wave device according to a first preferred embodiment of the present invention that is taken along line I-I in FIG. 2, which is described later.

An elastic wave device 1 includes a support substrate 2. The support substrate 2 includes a first main surface 2a and a second main surface 2b that face each other. A laminated film 3 is disposed on the first main surface 2a. The laminated film 3 includes a high-acoustic-velocity film 3a, a low-acoustic-velocity film 3b laminated on the high-acoustic-velocity film 3a, and a piezoelectric thin film 4 laminated on the low-acoustic-velocity film 3b. The piezoelectric thin film 4 defines the top layer of the laminated film 3. The high-acoustic-velocity film 3a is a film through which a bulk wave propagates at an acoustic velocity higher than an acoustic velocity at which an elastic wave in a main mode propagates through the piezoelectric thin film 4. The low-acoustic-velocity film 3b is a film through which a bulk wave propagates at an acoustic velocity lower than an acoustic velocity at which an elastic wave in the main mode propagates through the piezoelectric thin film 4.

The acoustic velocity of a bulk wave is inherent in a material, and there is a P-wave that vibrates in the direction in which the wave propagates, that is, in a longitudinal direction, and an S-wave that vibrates in a direction perpendicular to the direction in which the wave propagates, that is, in a transverse direction. The bulk waves propagate through the piezoelectric thin film, the high-acoustic-velocity film, and the low-acoustic-velocity film. In the case of an isotropic material, there is a P-wave and an S-wave. In the case of an anisotropic material, there is a P-wave, an S-wave that propagates at a low velocity, and an S-wave that propagates at a high velocity. When a surface acoustic wave is excited by using an anisotropic material, a shear horizontal (SH) wave and a shear vertical (SV) wave are generated as two types of S-waves. In the present disclosure, the acoustic velocity of an elastic wave in the main mode that propagates through the piezoelectric thin film means an acoustic velocity in one of three modes of the P-wave, the SH-wave, and the SV-wave that is used to achieve the pass band of a filter or the resonance characteristics of a resonator.

A close-contact layer may be provided between the low-acoustic-velocity film 3b and the piezoelectric thin film 4. The close-contact layer enables adhesion between the low-acoustic-velocity film 3b and the piezoelectric thin film 4 to be improved. The close-contact layer only needs to be made of a resin or a metal, and an epoxy resin or a polyimide resin, for example, may be used for the close-contact layer.

In the present preferred embodiment, the piezoelectric thin film 4 preferably is made of LiTaO$_3$, but another type of piezoelectric single crystal may be used for the piezoelectric thin film 4. The film thickness of the piezoelectric thin film 4 is preferably less than or equal to about 1.5 times λ, where λ represents the wavelength of an elastic wave that is determined in accordance with the electrode period of an IDT electrode. In this case, the film thickness of the piezoelectric thin film 4 preferably is selected from a range of about 1.5 times λ or less, because an electromechanical coupling coefficient is able to be readily adjusted.

The high-acoustic-velocity film 3a is made of an appropriate material that satisfies the above relationship of the acoustic velocity. Examples of such a material include aluminum nitride, aluminum oxide, silicon carbide, silicon nitride, silicon oxynitride, DLC, and diamond. A mixed material whose main component includes such a material may be used for the high-acoustic-velocity film 3a.

The low-acoustic-velocity film 3b is made of an appropriate material through which a bulk wave propagates at an acoustic velocity lower than an acoustic velocity at which an elastic wave in the main mode propagates through the piezoelectric thin film 4. Examples of such a material include silicon oxide, glass, silicon oxynitride, tantalum oxide, and a compound in which fluorine, carbon, or boron is added to silicon oxide. A mixed material whose main component includes such a material may be used for the low-acoustic-velocity film 3b.

Since the high-acoustic-velocity film 3a and the low-acoustic-velocity film 3b are laminated together with the piezoelectric thin film 4, a Q factor is able to be improved as disclosed in International Publication No. WO2012/086639.

The close-contact layer may be provided between the low-acoustic-velocity film 3b and the piezoelectric thin film 4. The formation of the close-contact layer enables the adhesion between the low-acoustic-velocity film 3b and the piezoelectric thin film 4 to be improved. The close-contact layer only needs to be made of a resin or a metal, and an epoxy resin or a polyimide resin, for example, may be used for the close-contact layer.

In the laminated film 3, plural high-acoustic-velocity films and plural low-acoustic-velocity films may be laminated. The laminated film 3 may include a film other than the piezoelectric thin film 4, the high-acoustic-velocity film 3a, and the low-acoustic-velocity film 3b, such as the close-contact layer or a dielectric film, as the top layer, the bottom layer, or a layer at an interface located in the laminated film 3.

IDT electrodes 5a to 5c are disposed on the piezoelectric thin film 4. The IDT electrodes 5a to 5c are electrically connected to each other by wire electrodes 6a to 6d. The wire electrodes 6a to 6d each have a foundation layer. The main material of the foundation layer is Ti or NiCr.

In the present preferred embodiment, surface acoustic wave resonators including the IDT electrodes 5a to 5c are connected to each other and define a band-pass filter. In the present preferred embodiment, a filter circuit is not particularly limited.

A hollow space 7 is provided to prevent elastic waves excited by the IDT electrodes 5a to 5c from being restricted. That is, a support layer 8 including a cavity is disposed on the support substrate 2. The support layer 8 is made of a synthetic resin such as a polyimide resin.

A cover 9 is installed so as to seal the cavity of the support layer 8. The cover 9 and the support layer 8 seal the hollow space 7.

Through-holes preferably extend through the support layer 8 and the cover 9. Under-bump metallic layers 10a and 10b are preferably provided in the respective through-holes. Metallic bumps 11a and 11b are joined to the under-bump metallic layers 10a and 10b. The under-bump metallic layers 10a and 10b and the metallic bumps 11a and 11b define external connection terminals in various preferred embodiments of the present invention. The external connection terminals are electrically connected to the IDT electrodes and enable the elastic wave device to be electrically connected to the outside. Each of the external connection terminals only needs to include at least one of the under-bump metallic layer and the metallic bump.

The under-bump metallic layers 10a and 10b and the metallic bumps 11a and 11b are made of appropriate metals or alloys.

The lower end of the under-bump metallic layer 10a is joined to the wire electrode 6a. The lower end of the under-bump metallic layer 10b is joined to the wire electrode 6d. A portion of the wire electrode 6a and a portion of the wire electrode 6d that are joined to the under-bump metallic layers 10a and 10b are electrode lands to which the respective external connection terminals are connected. In the present preferred embodiment, the under-bump metallic layers 10a and 10b and the metallic bumps 11a and 11b define and function as the external connection terminals.

An insulating layer 12 is disposed on the support substrate 2. The support layer 8 is disposed directly on the insulating layer 12. When the main material of the foundation layer is NiCr, it is good because the adhesion between the foundation layer and the polyimide resin (the insulating layer 12) is high.

A feature of the elastic wave device 1 according to the preferred embodiment is that the support layer 8 and the insulating layer 12 are made of the same material. This improves adhesion between the support layer 8 and the insulating layer 12. Accordingly, the sealability of the hollow space 7 is effectively improved. In addition, the support layer 8 and the insulating layer 12 preferably have the same coefficient of linear expansion. This makes it difficult for stress to be generated at the interface between the support layer 8 and the insulating layer 12 due to thermal shock. The reliability of the elastic wave device 1 thus is effectively improved.

In the present preferred embodiment, the support layer 8 and the insulating layer 12 are made of the same material and formed integrally with each other. Accordingly, the above advantageous effects are further improved. The support layer and the insulating layer, however, may not be formed integrally with each other. The above advantageous effects are able to be realized also in this case.

Since the support layer 8 and the insulating layer 12 are made of the same material, the number of types of materials used is decreased, and the cost is reduced. It is not necessary for the material of the support layer and the material of the insulating layer to be identical, but the material of the support layer and the material of the insulating layer only need to be substantially the same.

The phrase "the support layer 8 and the insulating layer 12 are made of the same material" means that the main component of a material of which the support layer 8 is made is preferably about 50% or more identical to the main component of a material of which the insulating layer 12 is made. The main component of the material of which the support layer 8 is made is preferably about 75% or more identical to the main component of the material of which the insulating layer 12 is made. The main component of the material of which the support layer 8 is made is more preferably about 90% or more identical to the main component of the material of which the insulating layer 12 is made. The main component of the material of which the support layer 8 is made is further preferably about 100% identical to the main component of the material of which the insulating layer 12 is made. In particular, in the case where the support layer 8 and the insulating layer 12 are made of a synthetic resin such as a polyimide resin, for example, the adhesion between the support layer 8 and the insulating layer 12 is further improved.

The phrase "the support layer 8 and the insulating layer 12 have the same coefficient of linear expansion" means that the difference between the coefficient of linear expansion of the support layer 8 and the coefficient of linear expansion of the insulating layer 12 is about 50% or less. The difference between the coefficient of linear expansion of the support layer 8 and the coefficient of linear expansion of the insulating layer 12 is preferably about 30% or less. The difference between the coefficient of linear expansion of the support layer 8 and the coefficient of linear expansion of the insulating layer 12 is more preferably about 10% or less.

Figure 2:
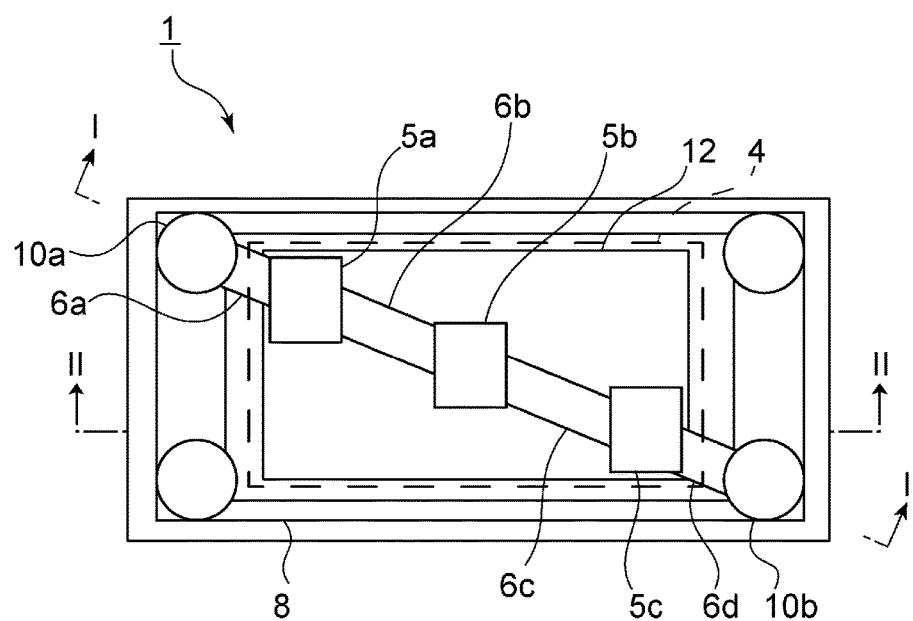
FIG. 2 is a schematic plan view of the elastic wave device according to the first preferred embodiment of the present invention in which a cover is omitted.
Figure 3:
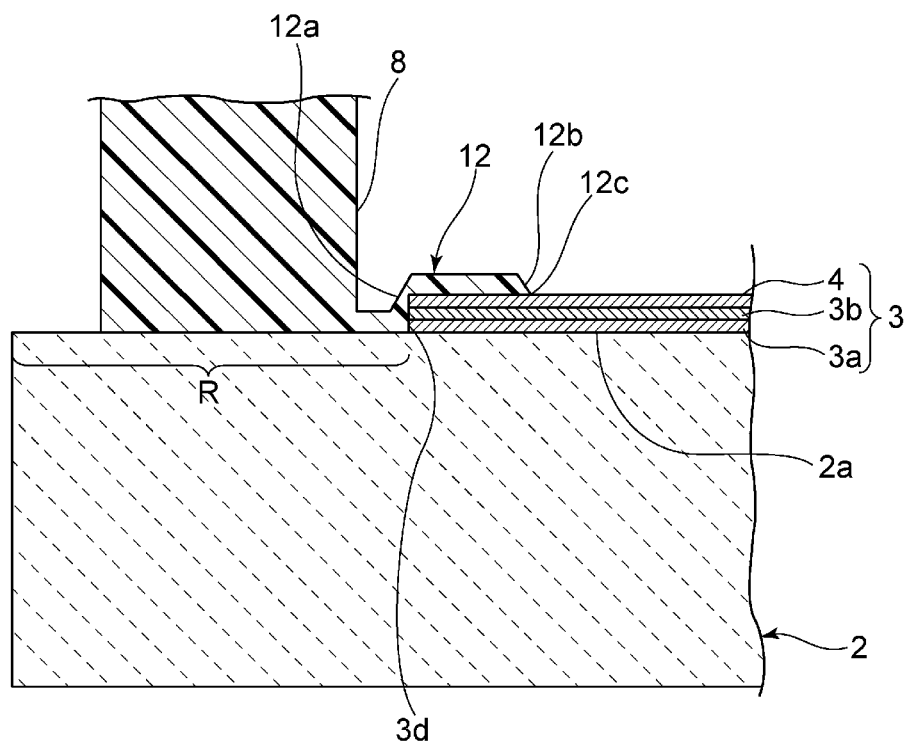
FIG. 3 is an enlarged partial sectional view of the elastic wave device that is taken along line II-II in FIG. 2.

FIG. 2 is a schematic plan view of the elastic wave device 1. In FIG. 2, an electrode structure below the cover 9 is schematically seen through the cover 9. Regions in which the IDT electrodes 5a to 5c are disposed are schematically illustrated by rectangles. FIG. 3 is an enlarged partial sectional view of the elastic wave device that is taken along line II-II in FIG. 2. Note that FIG. 1 is a sectional view of the elastic wave device along line I-I in FIG. 2.

As illustrated in FIG. 3, the area of a portion at which the support layer 8 is joined to the insulating layer 12 is large at a position at which the wire electrode 6a is not disposed. In addition, as illustrated in FIG. 1, the wire electrodes 6a and 6d do not extend to an outer circumferential portion 8a of the support layer 8 in the present preferred embodiment. The support layer 8 is thus joined to the insulating layer 12 over the entire outer circumferential portion 8a. Accordingly, the sealability of the hollow space 7 is effectively improved and the reliability of the elastic wave device 1 is effectively improved.

Figure 4:
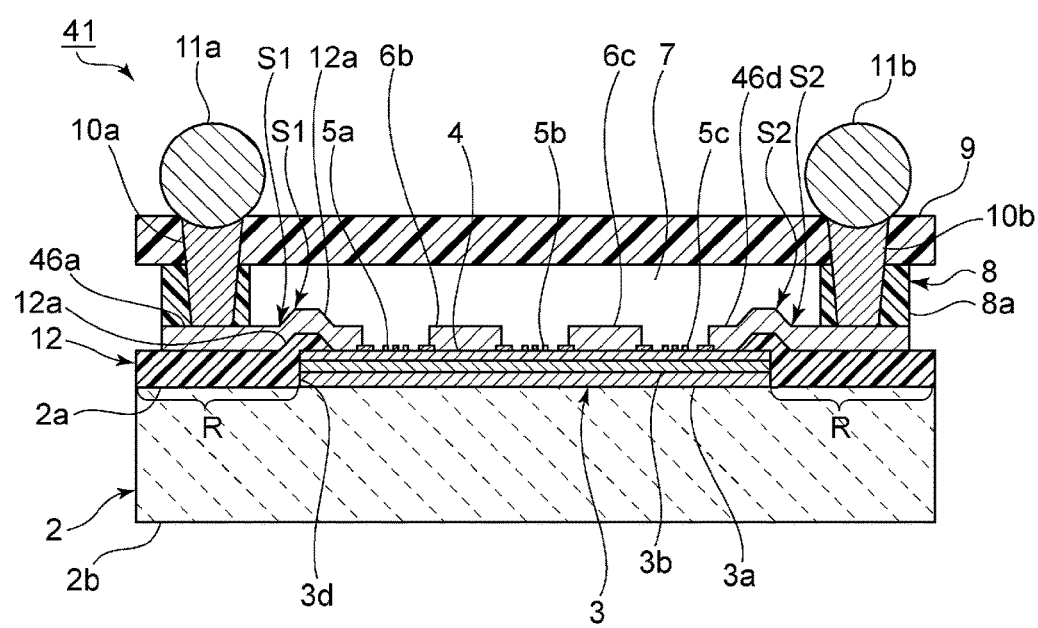
FIG. 4 is a sectional view of an elastic wave device according to a first modification to the first preferred embodiment of the present invention that is taken along line I-I in FIG. 2.

As seen in an elastic wave device 41 according to a first modification of a preferred embodiment of the present invention illustrated in FIG. 4, wire electrodes 46a and 46d may extend to the outer circumferential portion 8a of the support layer 8. The support layer 8 is joined to the insulating layer 12 at positions at which the wire electrodes 46a and 46d are not disposed. In the first modification, the support layer 8 and the insulating layer 12 are not formed integrally with each other. The sealability of the hollow space 7 is improved also in this case.

Referring back to FIG. 1, portions of the laminated film laminated on the support substrate 2 are removed. More specifically, on the first main surface 2a of the support substrate 2, regions R in which the portions of the laminated film 3 are removed are provided outside the region in which the laminated film 3 is disposed. The regions R in which the portions of the laminated film 3 are removed each include at least a region outside the region in which the IDT electrodes 5a to 5c are disposed and below a region to which a corresponding one of the external connection terminals is joined.

In the present preferred embodiment, one of the regions to which the external connection terminals are joined is the lower end surface of the under-bump metallic layer 10a joined to the wire electrode 6a. That is, the lower end surface of the under-bump metallic layer 10a is one of the joined regions, and a region of the first main surface 2a of the support substrate 2 on which each of the joined regions is projected is the region below the joined region.

As described in the present preferred embodiment, the wire electrodes 6a and 6d preferably extend to the respective regions R. This enables the under-bump metallic layers 10a and 10b to be joined on the wire electrode 6a and 6d above the regions R and enables the metallic bumps 11a and 11b to be joined on the under-bump metallic layers 10a and 10b above the regions R. Accordingly, when the metallic bumps 11a and 11b are joined to the under-bump metallic layers 10a and 10b, the piezoelectric thin film 4 is less likely to crack and chip even when a force is applied to the piezoelectric thin film 4.

In a dicing process in which individual elastic wave devices 1 are obtained, dicing is preferably performed at the regions R. In such a manner, the piezoelectric thin film 4 is less likely to crack and chip.

The insulating layer 12 preferably extends from the regions R to side surfaces 3d of the laminated film 3 and extends to the upper surface of the piezoelectric thin film 4. In the present preferred embodiment, the insulating layer 12 includes, on the side opposite the first main surface 2a of the insulating layer 12, slanted surfaces 12a extending from the respective regions R to respective portions on the piezoelectric thin film 4. The wire electrode 6a includes a slanted surface 6a1 extending along the corresponding slanted surface 12a. Accordingly, the degree at which the wire electrode 6a bends is reduced at a position between the region in which the laminated film 3 is laminated and the corresponding region R. Breakage of a portion of the wire electrode 6a shown by arrows S1 is thus less likely to occur. The degree at which a portion of the wire electrode 6d shown by arrows S2 bends is also reduced. Breakage of the wire electrode 6d is thus less likely to occur.

Figure 5A:
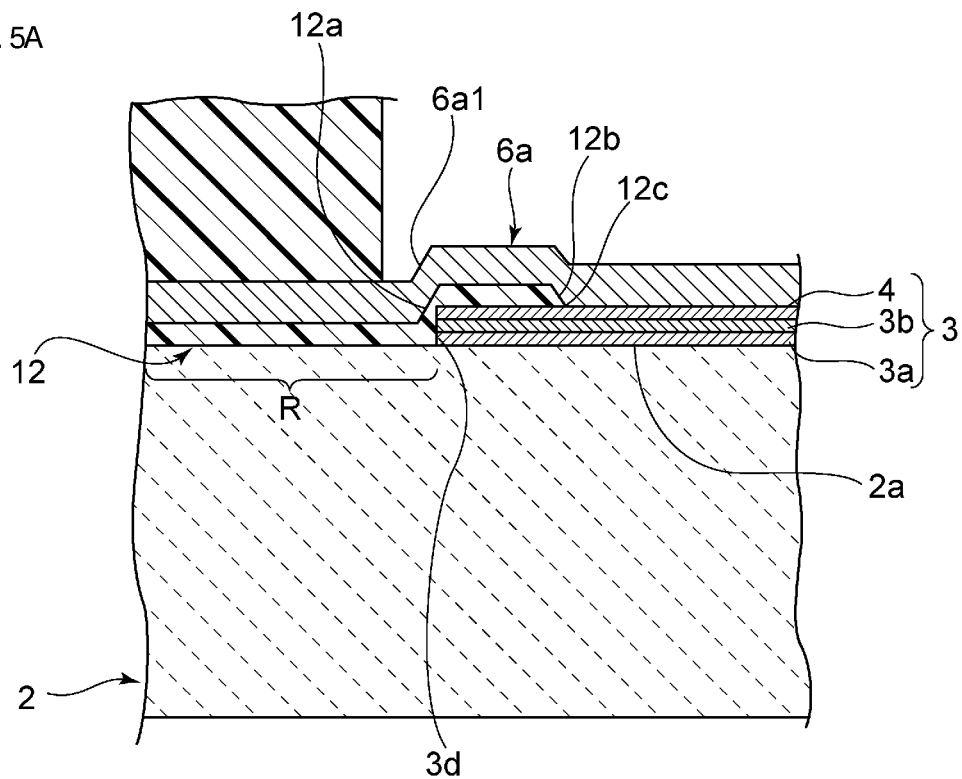
FIG. 5A is an enlarged partial sectional view illustrating a principal portion of the elastic wave device according to the first preferred embodiment of the present invention.
Figure 5B:
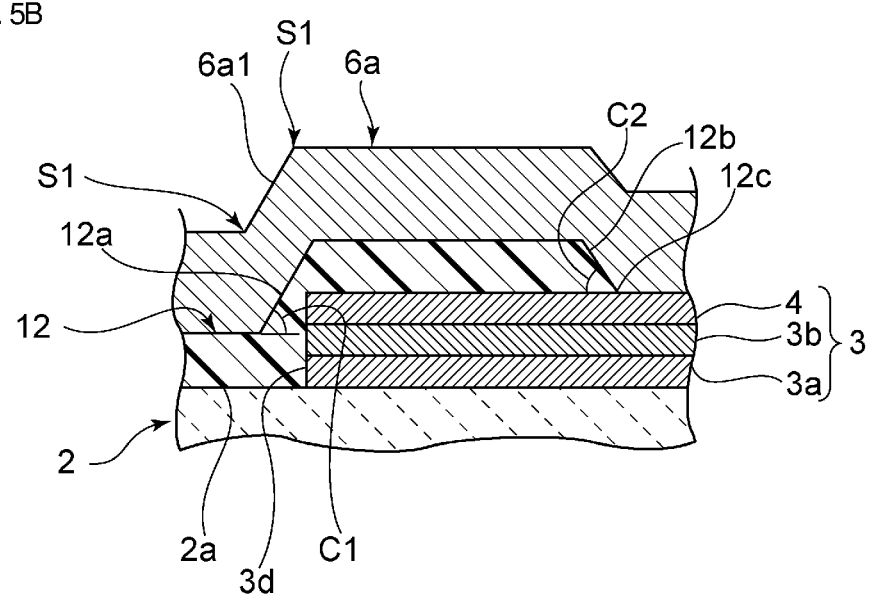
FIG. 5B is a partial sectional view of the principal portion in FIG. 5A that is further enlarged.

Further description in more detail with reference to FIG. 5A and FIG. 5B is provided.

FIG. 5A is an enlarged partial sectional view of the elastic wave device near a portion at which one of the regions R is in contact with the laminated film 3.

As illustrated in FIG. 5A, the insulating layer 12 extends from a portion located in the region R to a surface of the piezoelectric thin film 4. In this case, as illustrated in a further enlarged view in FIG. 5B, the slanted surface 12a of the insulating layer 12 is located above the side surface 3d of the laminated film 3. The slanted surface 12a extends from an upper portion of the region R to a position above the piezoelectric thin film 4. An angle C1 defined by the slanted surface 12a and the first main surface 2a of the support substrate 2 is preferably about 80° or less. In accordance with this angle, an angle defined by the slanted surface 6a1 of the wire electrode 6a and the first main surface 2a is decreased as above. The degree at which a portion of the wire electrode 6a at the slanted surface 6a1 bends is thus able to be reduced. In other words, the insulating layer 12 reduces the effect of steps between the upper surface of the piezoelectric thin film 4 and the first main surface 2a of the support substrate 2 at the respective regions R outside the side surfaces 3d of the laminated film 3. Breakage of the portion of the wire electrode 6a shown by arrows S1 is thus less likely to occur.

A slanted surface 12b is preferably provided at an inner side end 12c of the insulating layer 12. An angle C2 defined by the slanted surface 12b and the first main surface 2a is preferably about 80° or less. Breakage of the wire electrode 6a on the slanted surface 12b is thus less likely to occur.

The angle C1 defined by the slanted surface 12a and the first main surface 2a and the angle C2 defined by the slanted surface 12b and the first main surface 2a are preferably about 60° or less. The angle C1 defined by the slanted surface 12a and the first main surface 2a and the angle C2 defined by the slanted surface 12b and the first main surface 2a are more preferably about 45° or less.

The reduction in the degree at which the wire electrode 6a bends enables breakage of the wire electrode 6a to be significantly reduced or prevented when the wire electrode 6a is heated or the wire electrode 6a is formed.

The side surfaces 3d of the laminated film 3 are covered by the insulating layer 12. Accordingly, delamination of the laminated film 3 is less likely to occur at an interface in the laminated film 3.

Figure 6:
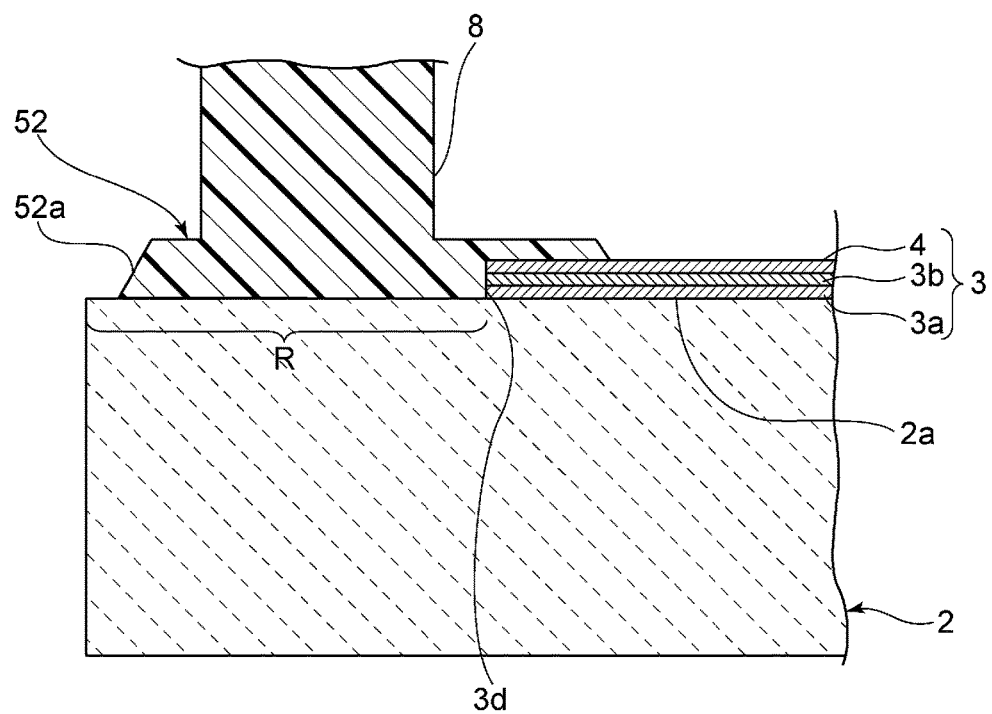
FIG. 6 is an enlarged partial sectional view of an elastic wave device according to a second modification to the first preferred embodiment that is taken along line II-II in FIG. 2.

FIG. 6 is an enlarged partial sectional view of an elastic wave device according to a second modification of a preferred embodiment of the present invention that is taken along line II-II in FIG. 2. As illustrated in FIG. 6, an insulating layer 52 may include a slanted surface 52a outside the support layer 8. In this case, adhesion between the support layer 8 and the insulating layer 52 is improved as in the first preferred embodiment. Accordingly, the reliability of the elastic wave device is effectively improved.

Figure 7A:
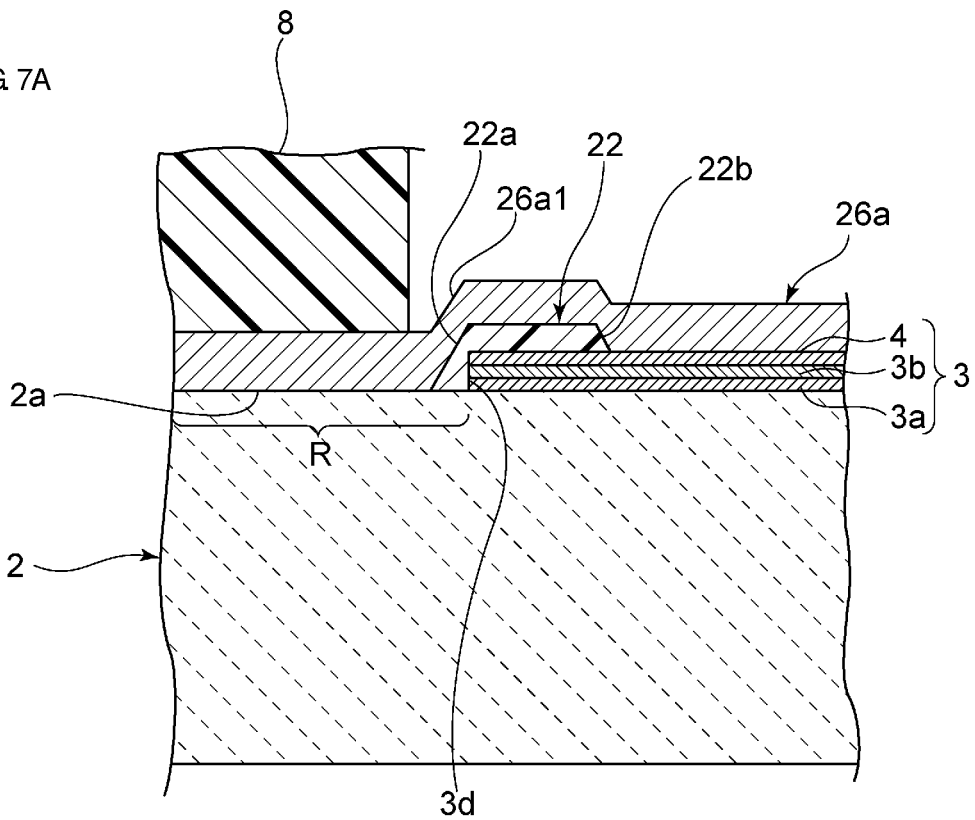
FIG. 7A is an enlarged partial sectional view illustrating a principal portion of an elastic wave device according to a second preferred embodiment of the present invention.
Figure 7B:
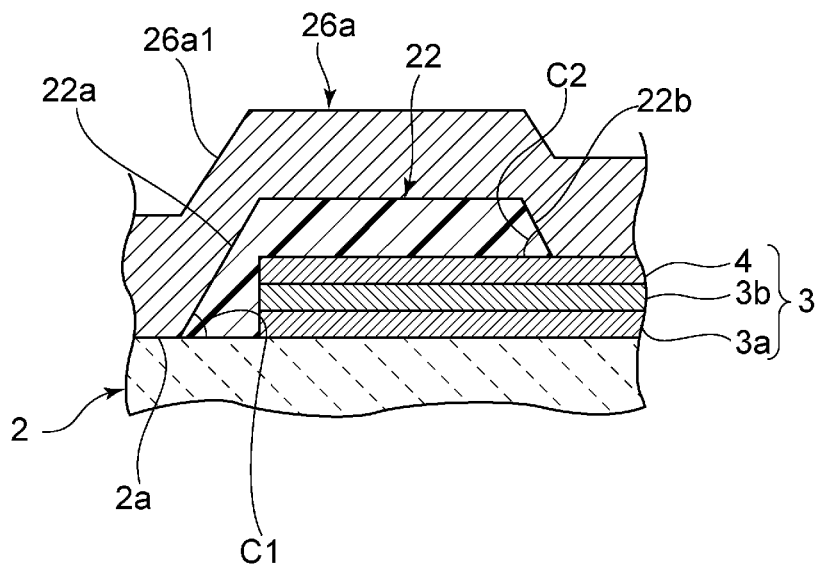
FIG. 7B is a partial sectional view of the principal portion in FIG. 7A that is further enlarged.

FIG. 7A is an enlarged partial sectional view illustrating a principal portion of an elastic wave device according to a second preferred embodiment of the present invention. FIG. 7B is a partial sectional view of the principal portion in FIG. 7A that is further enlarged. FIG. 7A and FIG. 7B are sectional views corresponding to FIG. 5A and FIG. 5B in the first preferred embodiment.

In the elastic wave device according to the second preferred embodiment, an insulating layer 22 is disposed on the support substrate 2 so as to extend from the region R on the first main surface 2a of the support substrate 2 to a surface of the piezoelectric thin film 4. In the elastic wave device 1 according to the first preferred embodiment, the insulating layer 12 extends to the outer sides of the regions R. In contrast, in the second preferred embodiment, an end of a slanted surface 22a of the insulating layer 22 is in contact with the first main surface 2a of the support substrate 2. In other words, the insulating layer 22 does not extend to a region outside the slanted surface 22a. A slanted surface 22b is provided on a portion located on the piezoelectric thin film 4 so as to be in contact with the upper surface of the piezoelectric thin film 4 as in the first preferred embodiment.

As illustrated in FIG. 7B, an angle C1 defined by the slanted surface 22a and the first main surface 2a and an angle C2 defined by the slanted surface 22b and the first main surface 2a are preferably about 80° or less as in the first preferred embodiment.

The angle C1 defined by the slanted surface 22a and the first main surface 2a and the angle C2 defined by the slanted surface 22b and the first main surface 2a are more preferably about 60° or less. The angle C1 defined by the slanted surface 22a and the first main surface 2a and the angle C2 defined by the slanted surface 22b and the first main surface 2a are further preferably about 45° or less.

Thus, the insulating layer 22 extending from a portion located on the piezoelectric thin film 4 may be terminated at the slanted surface 22a extending to the side of the region R. The piezoelectric thin film 4 is less likely to crack and chip also in this case when an under-bump metallic layer is joined to a wire electrode 26a above the region R and the metallic bump is joined to the under-bump metallic layer above region R as in the first preferred embodiment. The wire electrode 26a includes a slanted surface 26a1 and breakage of the wire electrode 26a is thus less likely to occur.

In addition, adhesion between the wire electrode 26a and the support substrate 2 is improved. Separation of the wire electrode 26a is thus less likely to occur.

In the elastic wave device, the support layer 8 is joined to the insulating layer 22 at a portion on which the wire electrode 26a is not disposed as in the elastic wave device 1 according to the first preferred embodiment. The sealability of the hollow space 7 is thus improved. Accordingly, the reliability of the elastic wave device is improved.

Figure 8:
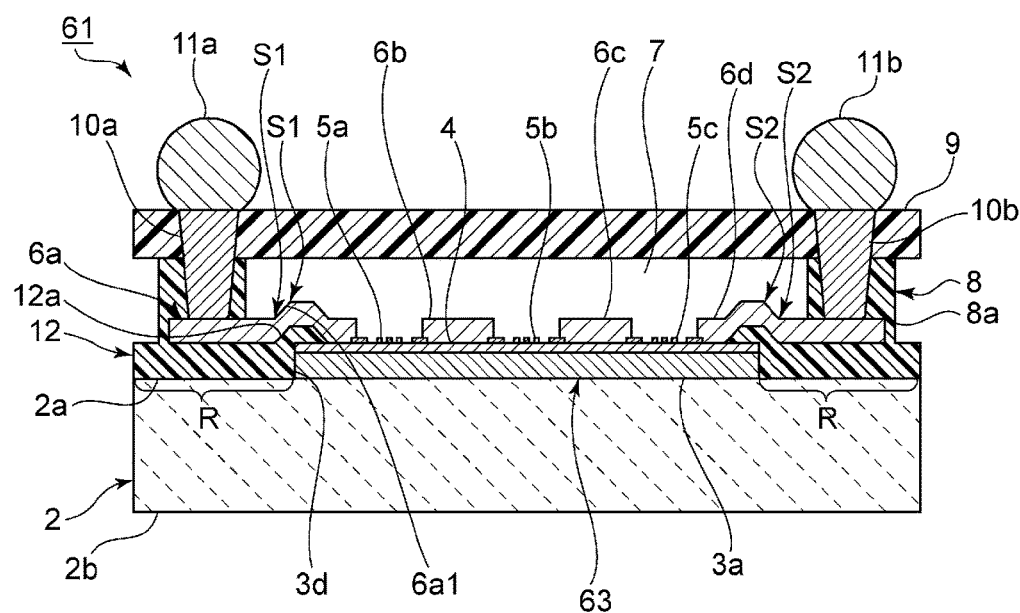
FIG. 8 is a sectional view of an elastic wave device according to a third preferred embodiment that is taken along line I-I in FIG. 2.

FIG. 8 is a sectional view of an elastic wave device according to a third preferred embodiment of the present invention that is taken along line I-I in FIG. 2.

An elastic wave device 61 differs from the elastic wave device 1 according to the first preferred embodiment in that a laminated film 63 does not include a low-acoustic-velocity film. The elastic wave device 61 preferably has the same structure as the elastic wave device 1 according to the first preferred embodiment except for the above difference.

In this case, the piezoelectric thin film is less likely to crack and chip and the reliability of the elastic wave device is effectively improved as in the first preferred embodiment. In addition, the Q factor is improved.

Figure 9:
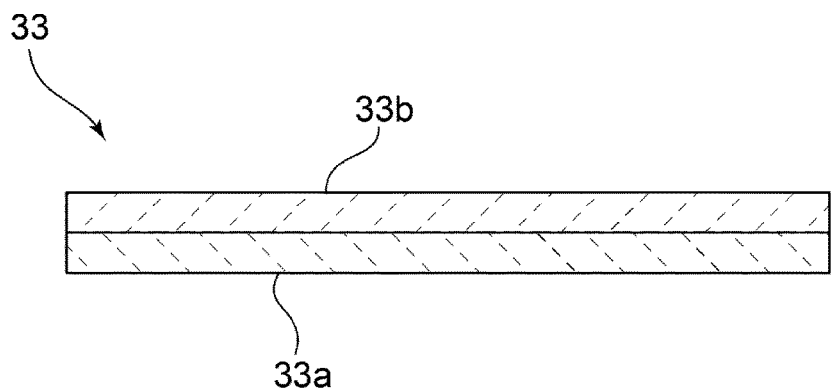
FIG. 9 is a front sectional view of a laminated film of an elastic wave device according a fourth preferred embodiment of the present invention.

FIG. 9 is a front sectional view of a laminated film of an elastic wave device according to a fourth preferred embodiment of the present invention. The fourth preferred embodiment preferably has the same structure as in the first preferred embodiment except for the structure of a laminated film 33.

In the fourth preferred embodiment, the laminated film includes a high-acoustic-impedance film 33a having a comparatively high acoustic impedance and a low-acoustic-impedance film 33b having a comparatively low acoustic impedance that is laminated on the high-acoustic-impedance film. The piezoelectric thin film 4 is laminated on the low-acoustic-impedance film 33b. Thus, the laminated film is not limited to a laminated film including the high-acoustic-velocity film and the low-acoustic-velocity film but may be a laminated film including the high-acoustic-impedance film and the low-acoustic-impedance film that are laminated together.

In various preferred embodiments of the present invention, the structure of the laminated film including the piezoelectric thin film is not particularly limited.

The laminated film may be formed of dielectric films that are laminated together in order to improve temperature characteristics.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave device comprising:
   a support substrate;
   a laminated film that is disposed on the support substrate and includes a piezoelectric thin film and a layer other than the piezoelectric thin film;
   an interdigital transducer electrode that is disposed on the piezoelectric thin film;
   an external connection terminal that is electrically connected to the interdigital transducer electrode and to an outside;
   an insulating layer;
   a support layer; and
   a cover; wherein
   a portion of the laminated film is omitted in a region outside a region in which the interdigital transducer electrode is disposed in plan view and below a region to which the external connection terminal is joined, and the insulating layer is disposed in at least a portion of the region in which the portion of the laminated film is omitted;
   the external connection terminal includes at least one of an under-bump metallic layer and a metallic bump;
   the support layer is disposed on the insulating layer so as to surround the region in which the interdigital transducer electrode is disposed, and a main component of a material of the support layer is identical to a main component of a material of the insulating layer; and
   the cover is secured to the support layer so as to seal a cavity defined by the support layer.

2. The elastic wave device according to claim 1, wherein the insulating layer extends from at least the portion of the region in which the portion of the laminated film is omitted to the surface of the piezoelectric thin film.

3. The elastic wave device according to claim 2, further comprising a wire electrode that is electrically connected to the interdigital transducer electrode, that extends from the surface of the piezoelectric thin film to a surface of the insulating layer, and that extends to a surface of a portion of the insulating layer disposed in the region in which the portion of the laminated film is omitted.

4. The elastic wave device according to claim 3, wherein the external connection terminal is joined to the wire electrode.

5. The elastic wave device according to claim 1, wherein the insulating layer and the support layer are made of a synthetic resin.

6. The elastic wave device according to claim 2, wherein the insulating layer extends from the surface of the piezoelectric thin film to a side surface of the piezoelectric thin film and a side surface of the laminated film and extends to at least the portion of the region in which the portion of the laminated film is omitted.

7. The elastic wave device according to claim 3, wherein
   the insulating layer includes, on a side opposite the support substrate, a slanted surface extending from a region in which the insulating layer is disposed on the support substrate to a portion of the insulating layer disposed on the piezoelectric thin film, and the slanted surface is slanted so as to extend toward the piezoelectric thin film with increasing distance from the support substrate; and
   the wire electrode includes a portion disposed on the slanted surface of the insulating layer and slanted along the slanted surface of the insulating layer.

8. The elastic wave device according to claim 7, wherein the insulating layer extends from the slanted surface of the insulating layer to a region in which the portion of the laminated film including the piezoelectric thin film is omitted.

9. The elastic wave device according to claim 7, wherein
   the slanted surface of the insulating layer extends to a region on the support substrate in which the portion of the laminated film is omitted and the insulating layer is not laminated; and
   the wire electrode extends to a region on the support substrate in which the portion of the laminated film is omitted and the insulating layer is not laminated.

10. The elastic wave device according to claim 1, wherein the layer of the laminated film other than the piezoelectric thin film includes a high-acoustic-velocity film through which a bulk wave propagates at an acoustic velocity higher than an acoustic velocity at which an elastic wave in a main mode propagates through the piezoelectric thin film, and the piezoelectric thin film is laminated on the high-acoustic-velocity film.

11. The elastic wave device according to claim 1, wherein the layer of the laminated film other than the piezoelectric thin film includes a high-acoustic-velocity film through which a bulk wave propagates at an acoustic velocity higher than an acoustic velocity at which an elastic wave in a main mode propagates through the piezoelectric thin film, and a low-acoustic-velocity film through which a bulk wave propagates at an acoustic velocity lower than an acoustic velocity at which an elastic wave in the main mode propagates through the piezoelectric thin film, the low-acoustic-velocity film is laminated on the high-acoustic-velocity film, and the piezoelectric thin film is laminated on the low-acoustic-velocity film.

12. The elastic wave device according to claim 1, wherein the laminated film includes a high-acoustic-impedance film having a comparatively high acoustic impedance and a low-acoustic-impedance film having an acoustic impedance lower than the acoustic impedance of the high-acoustic-impedance film.

13. The elastic wave device according to claim 1, wherein the elastic wave device uses at least one of shear horizontal waves, shear vertical waves, and P-waves that vibrate in a propagation direction.

14. The elastic wave device according to claim 11, further comprising a close-contact layer between the low-acoustic-velocity film and the piezoelectric thin film.

15. The elastic wave device according to claim 1, wherein the support layer and the insulating layer have a same coefficient of linear expansion.

16. The elastic wave device according to claim 1, wherein the main component of the material of the support layer is one of about 50%, about 75%, about 90% and about 100% identical to the main component of the material of the insulating layer.

17. The elastic wave device according to claim 1, wherein a difference between a coefficient of linear expansion of the support layer and a coefficient of linear expansion of the insulating layer is one of about 50%, about 30% and about 10%.

18. The elastic wave device according to claim 1, wherein the wire electrode does not extend to an outer circumferential portion of the support layer.

19. The elastic wave device according to claim 1, wherein wire electrode extends to an outer circumferential portion of the support layer.

20. The elastic wave device according to claim 7, wherein the slanted surface is slanted at an angle of one of about 80°, about 60°, and about 45°.

\* \* \* \* \*